United States Patent
Sakakibara et al.

(10) Patent No.: US 6,570,239 B2
(45) Date of Patent: May 27, 2003

(54) SEMICONDUCTOR DEVICE HAVING RESISTIVE ELEMENT

(75) Inventors: Jun Sakakibara, Anjo (JP); Hitoshi Yamaguchi, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/804,188

(22) Filed: Mar. 13, 2001

(65) Prior Publication Data

US 2001/0022385 A1 Sep. 20, 2001

(30) Foreign Application Priority Data

Mar. 16, 2000 (JP) ........................................ 2000-079345

(51) Int. Cl.[7] .............................................. H01L 21/26
(52) U.S. Cl. .................. 257/536; 257/328; 257/329; 257/330; 257/341; 257/353; 257/396; 438/270; 438/353; 438/361
(58) Field of Search ................................. 257/328, 329, 257/330, 341, 353, 396; 438/270, 353, 361

(56) References Cited

U.S. PATENT DOCUMENTS 5,828,101 A  10/1998  Endo ........................ 257/330
6,285,058 B1 * 9/2001 Narazaki et al. ............ 257/330

FOREIGN PATENT DOCUMENTS

| JP | 61-125174 | 6/1986 |
|----|-----------|--------|
| JP | 08-204195 | 8/1996 |
| JP | 10-214969 | 8/1998 |
| JP | 11-103058 | 4/1999 |
| JP | 11-150265 | 6/1999 |

OTHER PUBLICATIONS

U.S. patent application Ser. No. 09/688,154, Yamaguchi et al. filed Oct. 16, 2000.

* cited by examiner

Primary Examiner—David Nelms
Assistant Examiner—Mai-Huong Tran
(74) Attorney, Agent, or Firm—Posz & Bethards, PLC

(57) ABSTRACT

A trench is formed in an n+ type substrate in a vertical direction from a main surface of the substrate, and a p type layer is deposited in the trench to have a recess portion. An n+ type layer is embedded in the recess portion. Accordingly, the p type layer is formed, as a resistive element, into a U-shape with ends that are ended on the main surface of the substrate. The resistive element has a resistance length corresponding to a path of the U-shape.

10 Claims, 7 Drawing Sheets

SEMICONDUCTOR DEVICE HAVING RESISTIVE ELEMENT

CROSS REFERENCE TO RELATED APPLICATION

This application is based upon and claims the benefit of Japanese Patent Application No. 2000-79345 filed on Mar. 16, 2000, the contents of which are incorporated herein by reference.

BACKGROUND OF THE INVENTION

1. Field of the Invention

This invention relates to a semiconductor device having a resistive element made of semiconductor.

2. Description of the Related Arts

Conventionally used semiconductor resistors (resistive elements) are a diffusion resistor, a poly silicon resistor, and so forth. A diffusion resistor is formed, for example, by doping impurities into a semiconductor substrate by ion implantation, and then by thermally diffusing the impurities. A poly silicon resistor is formed, for example, by forming a poly silicon film into which impurities are doped through an insulating film on a semiconductor substrate, and by patterning the poly silicon film.

Figure 10:
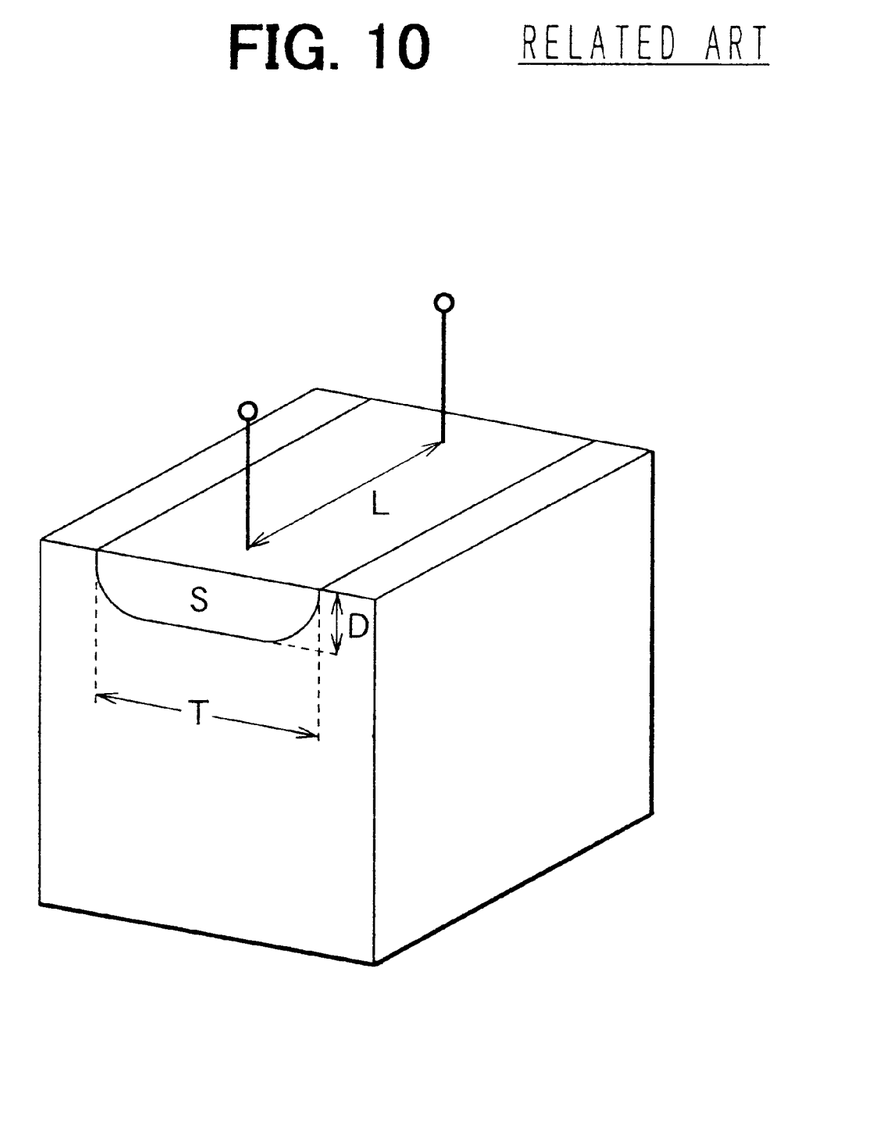
FIG. 10 is a perspective cross-sectional view showing a related art semiconductor device.

FIG. 10 schematically shows a diffusion resistor formed in a semiconductor substrate. The diffusion resistor has a value of resistance that is determined by resistance length (distance between both ends) L and sectional area S thereof. To increase the value of resistance, at least one of width T and thickness D of the diffusion resistor is decreased so that the sectional area S is decreased, or the resistance length L is lengthened. As opposed to this, to decrease the value of resistance, at least one of the width T and the thickness D of the diffusion resistor is increased, or the resistance length L is shortened.

When the width T and the thickness D are decreased to increase the value of resistance, however, a current density in the diffusion resistor is increased. The increased current density is liable to cause damages to the element. Further, the lengthened resistance length L is disadvantageous to high integration. The increased with T of the diffusion resistor is also disadvantageous to high integration. The increased thickness D requires larger number of times of ion-implantations, and a longer period of heat treatment time, thereby lowering throughput. The lengthened resistance length L further causes an increase of variation thereof.

SUMMARY OF THE INVENTION

The present invention has been made in view of the above problems. An object of the invention is to provide a semiconductor device including a resistor structure with high resistance and high reliability. Another object of the invention is to provide a semiconductor device including a resistor structure suitable to high integration even when a resistance length is increased.

According to the present invention, briefly, a semiconductor device has a semiconductor substrate of a first conductivity type, and a resistive element of a second conductivity type, extending from a main surface in a thickness direction of the semiconductor substrate. The resistive element has an impurity concentration that is approximately uniform in the thickness direction of the semiconductor substrate.

In the semiconductor device, for example, when a resistance length of the resistive element is parallel to the thickness direction of the substrate, the resistance length can be increased by increasing the depth of the resistive element, resulting in high resistance of the resistive element. Even when the resistance length is increased as above, the increased resistance length does not disturb high integration of the element.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

A semiconductor device to which the present invention is applied in a first embodiment is explained with reference to FIG. 1.

The semiconductor device has an $n^+$ type substrate 1 having a main surface 1$a$ and a back surface 1$b$. A trench 2 is formed from the main surface 1$a$ of the $n^+$ type substrate 1 in a vertical direction to have a depth of, for example, about 10 to 100 $\mu$m. A p type layer (resistive layer) 3 is deposited in the trench 2 with a recess portion, and an $n^+$ type layer 4 is embedded in the recess portion of the p type layer 3. The p type layer 3 extends in the vertical direction from the main surface 1$a$ of the $n^+$ type substrate 1 and has a U-shape both ends of which are ended on the main surface 1$a$ accordingly. This p type layer 3 constitutes a resistor (resistive element).

The p type layer 3 and the $n^+$ type layer 4 are formed by epitaxial growth so that those impurity concentrations are uniform in the depth direction of the trench 2 (thickness direction of the substrate 1). For example, the impurity concentration of the p type layer 3 is about $1\times10^{14}$ to $1\times10^{19}$ cm$^{-3}$, and the impurity concentration of the n type layer 4 is about $1\times10^{18}$ to $1\times10^{19}$ cm$^{-3}$. Both the end portions of the U-shaped p type layer 3 are connected to electrical wiring members (or electrodes) 5. Therefore, the resistance length corresponds to a path of the U-shape, main (side) parts of which extends in parallel with the thickness direction of the $n^+$ type substrate 1. That is, it can be specified that the resistance length is mainly parallel to the thickness direction of the $n^+$ type substrate 1. The main (side) parts of the resistive element (p type layer 3) extending in parallel with the thickness direction are preferably much longer than a bottom part thereof connecting the main parts.

In the resistive element having the above-mentioned structure, the depth of the trench 2 determines the resistance length, while the width and the length of the p type layer 3, both of which are perpendicular to the paper space, determine the sectional area of the resistor.

The p type layer 3 constituting the resistive element in this embodiment can change its resistance length in accordance with the depth of the trench 2. The deeper the depth of the trench 2 is, the larger the resistance length of the p type layer 3 is. Therefore, the resistance length can be lengthened without reducing the sectional area. Even in a case of increasing the value of resistive element damages does not occur due to an increased current density, and high integration can be realized despite the lengthened resistance length.

Next, a method for manufacturing the semiconductor device having the above-mentioned resistor structure is explained with reference to FIGS. 2A to 2E.

Figures 2A, 2B, 2C, 2D, 2E:
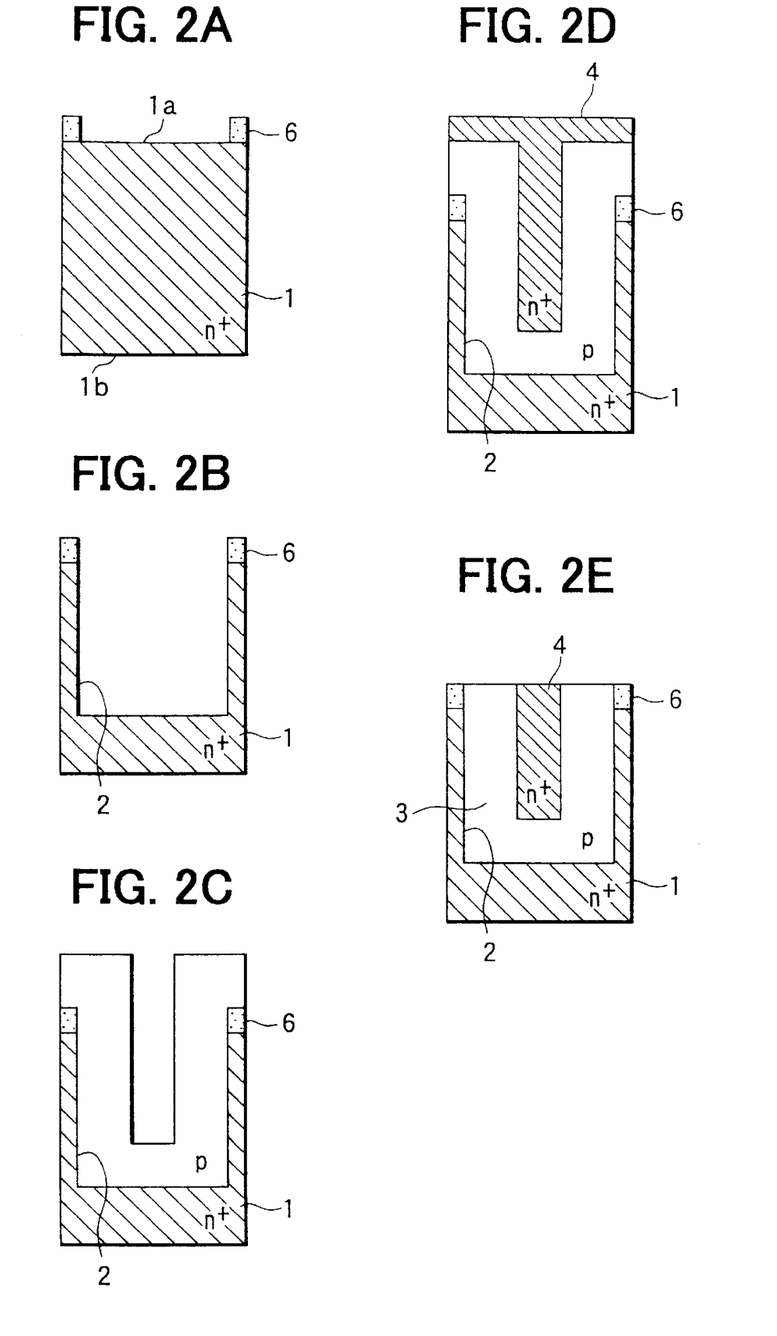
FIGS. 2A to 2E are cross-sectional views showing a method for manufacturing the semiconductor device shown in FIG. 1 in a stepwise manner.

[Step shown in FIG. 2A]

First, the $n^+$ type substrate 1 is prepared. Then, a silicon oxide film 6 is formed on the $n^+$ type substrate 1 by thermal oxidation or a CVD method. The silicon oxide film 6 is then etched through a photo-lithography step to have an opening where the p type layer 3 is to be formed.

[Step shown in FIG. 2B]

Next, trench etching is performed using the silicon oxide film 6 as a mask, and accordingly the trench 2 of, for example, 10 to 100 μm in depth is formed. The value of resistance of the p type layer 3 can be controlled based on the depth of the trench 2 at this step. The trench etching is either of dry etching and wet etching.

[Step shown in FIG. 2C]

Successively, the p type layer 3 is deposited on the inner wall surface of the trench 2. Because the p type layer 3 is epitaxially grown at this step, the p type layer 3 can have an approximately uniform thickness (width) parallel to the main surface 1a and approximately uniform concentration distribution. Controlling the impurity concentration and the thickness of the p type layer 3 at this step can also control the value of resistance of the p type layer 3.

[Step shown in FIG. 2D]

Next, the $n^+$ type layer 4 is deposited to fill the trench 2 completely and to cover the p type layer 3. Because this $n^+$ type layer 4 is also epitaxially grown at this step, the $p^+$ type layer 4 can have an approximately uniform thickness and approximately uniform concentration distribution.

[Step shown in FIG. 2E]

A polishing treatment is performed from the main surface side of the substrate 1 to flatten the $n^+$ type layer 4 and the p type layer 3 using the silicon oxide film 6 that works as an etching stopper. Finally, though it is not shown, the electrical wiring members 5 (FIG. 1) are formed and patterned to contact the p type layer 3 at the main surface side of the substrate 1, thereby completing the semiconductor device having the resistor structure as shown in FIG. 1.

(Second Embodiment)

Figure 1:
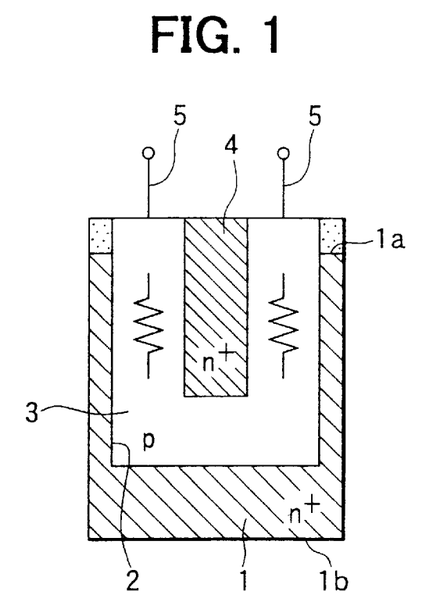
FIG. 1 is a cross-sectional view showing a semiconductor device in a first embodiment of the invention.

In a second embodiment of the invention, another method for manufacturing the semiconductor device shown in FIG. 1 is explained with reference to FIGS. 3A to 3E.

Figure 3A:
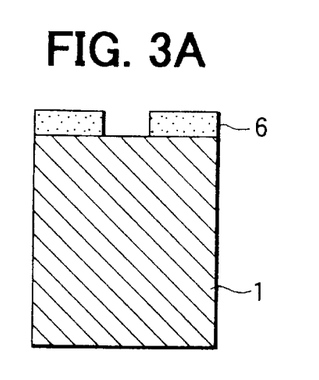
FIGS. 3A to 3E are cross-sectional view showing another method for manufacturing the semiconductor device in a stepwise manner in a second embodiment of the invention.

[Step shown in FIG. 3A]

First, similarly to the step shown in FIG. 2A, after the silicon oxide film 6 is formed on the $n^+$ type substrate 1, an opening is formed, by etching, in a region of the silicon oxide film 6 where the $n^+$ type layer 4 is to be formed.

Figure 3B:
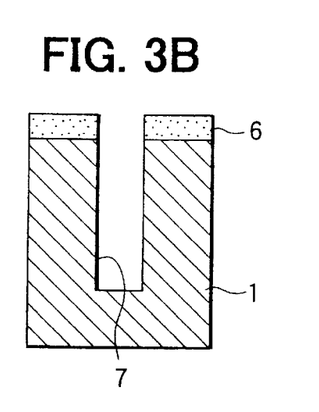

[Step shown in FIG. 3B]

Next, similarly to the step shown in FIG. 2B, trench etching is performed using the silicon oxide film 6 as a mask, thereby forming a trench 7 in the $n^+$ type substrate 1 at a depth of, for example, 10 to 100 μm.

Figure 3C:
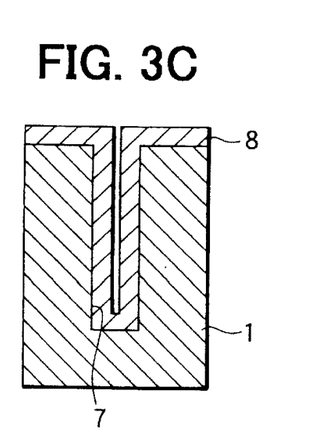

[Step shown in FIG. 3C]

After the silicon oxide film 6 is removed, a p type film 8 such as a BSG film, containing p type impurities, is deposited in the trench 7 to cover the $n^+$ type substrate 1.

Figure 3D:
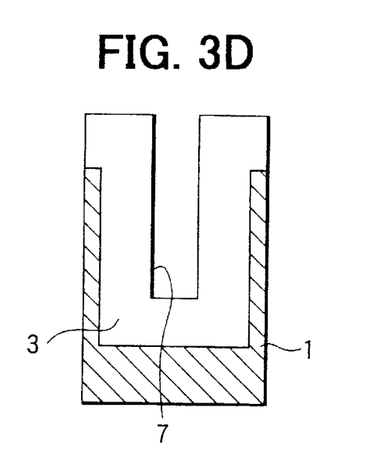

[Step shown in FIG. 3D]

Successively, a drive heat treatment is performed, for example, in $N_2$ atmosphere at 950 to 1150° C. Accordingly, p type impurities in the p type film 8 are thermally diffused (at a solid phase), so that a surface region of the $n^+$ type substrate 1 having a specific thickness is inverted to p type. The inverted region corresponds to the p type layer 3. Because the thermally diffused amount is approximately uniform, the concentration distribution is also approximately uniform. The depth of the trench 7 can appropriately control the value of resistance of the p type layer 3. After that, the p type film 8 is removed.

Figure 3E:
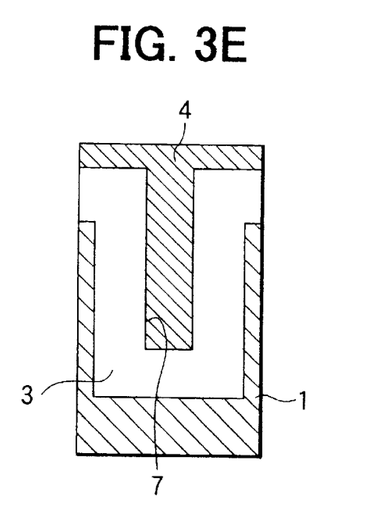

[step shown in FIG. 3E]

Then, similarly to the step shown in FIG. 2D, the $n^+$ type layer 4 is deposited to fill the trench 7 completely, and to cover the p type layer 3. After that, the step shown in FIG. 2E is performed, thereby forming the semiconductor device shown in FIG. 1.

In the present embodiment, although the p type layer 3 is formed by solid-phase diffusion, the p type layer 3 can be formed by gas-phase diffusion or liquid-phase diffusion.

(Third Embodiment)

Figure 4:
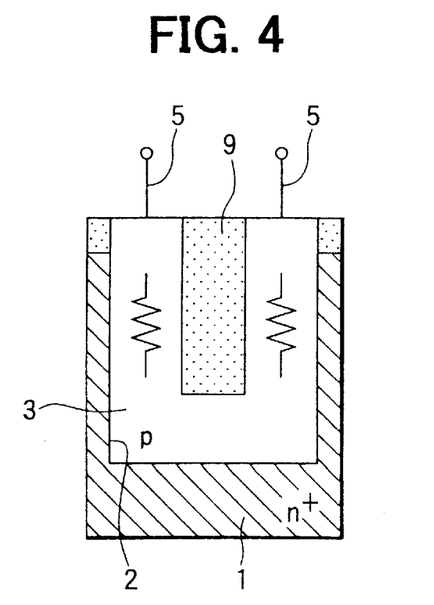
FIG. 4 is a cross-sectional view showing a semiconductor device in a third embodiment of the invention.

In the first and second embodiments, as shown in FIG. 1, the recess portion of the p type layer 3 is filled with the $n^+$ type layer 4. In a third embodiment, as shown in FIG. 4, it is filled with an insulating film 9 made of silicon oxide or the like, in stead of the $n^+$ type layer 4.

(Fourth Embodiment)

In a fourth embodiment, a semiconductor device in which a resistive element and other elements are formed in one chip together is explained with reference to FIG. 5.

Figure 5:
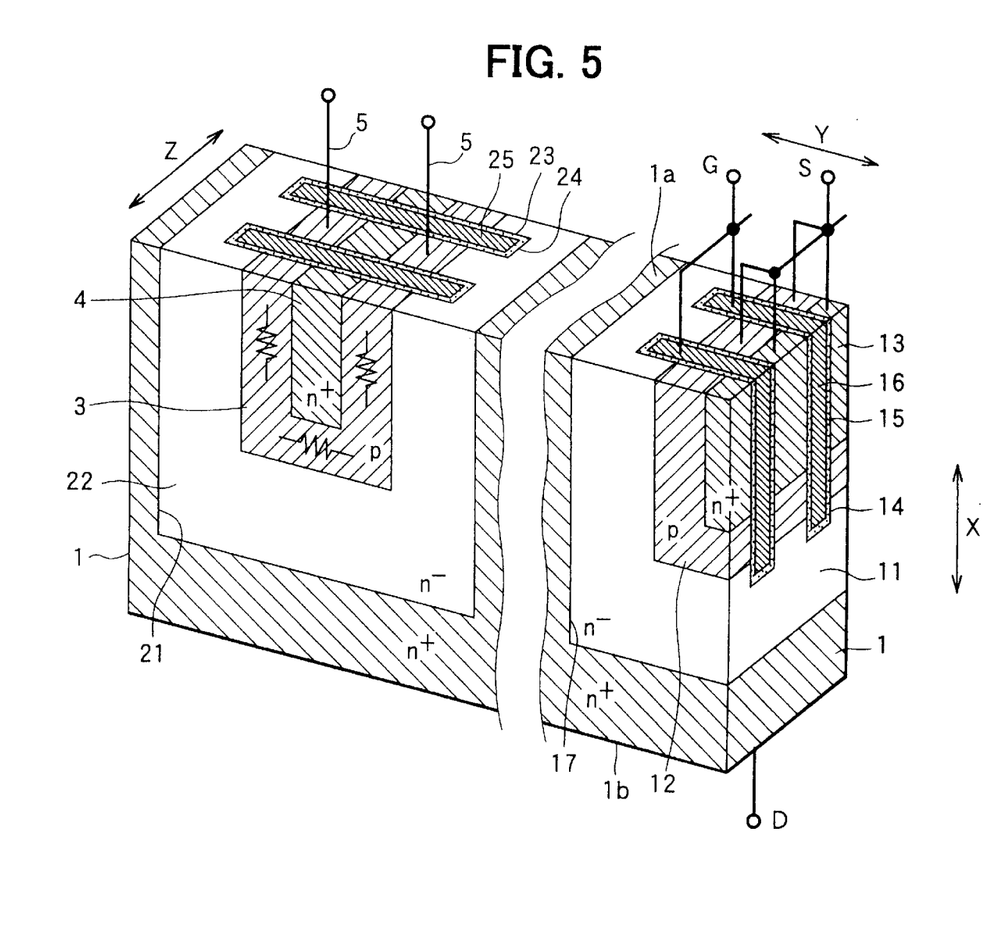
FIG. 5 is a perspective cross-sectional view showing a semiconductor device in a fourth embodiment of the invention.

As shown in FIG. 5, the basic structure of the resistive element is approximately the same as that shown in FIG. 1 except for the following points. Specifically, an $n^-$ type layer 22, disposed in a trench 21, is provided between the $n^-$ type substrate 1 and the p type layer 3, and the p type layer 3 is divided by an insulating film 24 and a poly silicon layer 25 which are disposed in trenches 23.

Meanwhile, a power MOSFET is formed in the $n^+$ type substrate 1 together with the resistive element. In the figure, arrowed direction X is the thickness direction of the $n^+$ type substrate 1, and arrowed directions Y and Z are directions respectively parallel to the main surface 1a and the back surface 1b of the $n^+$ type substrate 1. The directions X, Y, Z in the figures are perpendicular to one another.

An $n^-$ type drift region 11 is formed with a specific depth from the main surface 1a of the substrate 1. A p type base region 12 is formed with a specific depth from the main surface 1a, within the n⁻ type drift region 11. The depth of the p type base region 12 is, for example, about 10 to 100 μm. An n⁺ type source region 13 is further formed in the p type base region 12. The n⁺ type source region 13 has a depth of about 10 to 100 μm, but is somewhat shallower than the p type base region 12. The concentration of the n⁺ type substrate 1 is approximately the same as that of the n⁺ type source region 13, and the n⁺ type substrate 1 constitutes a drain region.

Then, trenches 14 are dug perpendicularly from the main surface 1a of the n⁺ type substrate 1, i.e., in the direction approximately parallel to the direction X. The trenches 14 penetrate the n⁺ type source region 13 and the p type base region 12 both in the direction Y parallel to the main surface 1a and the direction X parallel to the depth direction. A gate oxide film 15 is formed on the surfaces of the trenches 14, and a gate electrode 16 is embedded in the trenches 14 with the gate oxide film 15 interposed.

The power MOSFET having the structure as described above is manufactured, for example, as follows.

First, after a trench 17 is formed where the n⁻ type drift region 11 is to be formed in the n⁺ type substrate 1, three layers of an n⁻ type film, a p type film, and an n⁺ type film are deposited on the main surface 1a of the n⁺ type substrate 1 including the trench 17. Then, the surface of the three layers is flattened. Accordingly, the n⁻ type drift region 11, the p type base region 12, and the n⁺ type source region 13 are formed. Next, the trenches 14 are formed from the main surface 1a of the n⁺ type substrate 1, and the inner wall surfaces of the trenches 14 are oxidized, thereby forming the gate oxide film 15. Further, a poly silicon layer is embedded in the trenches 14 through the gate oxide film 15 to form the gate electrode 16. After that, a gate wiring member G and a source wiring member S are patterned at the side of the main surface 1a, while a drain wiring member D is formed at the side of the back surface 1b, thereby completing the power MOSFET.

Thus, the semiconductor device can include the power MOSFET and the resistive element together. Also in this kind of the semiconductor device, the resistive element can be formed at the same time when the power MOSFET is formed by modifying the mask shape used for forming the power MOSFET. Specifically, the trench 12 of the resistive element is formed simultaneously with the trench 17 of the power MOSFET, the n⁻ type layer (first semiconductor layer) 22 is formed simultaneously with the n⁻ type drift region 11, the p type layer 3 is formed simultaneously with the p type base region 12, the n⁺ type layer (second semiconductor layer) 4 is formed simultaneously with the n⁺ type source region 13, the trenches 23 are formed simultaneously with the trenches 14, the insulating film 24 is formed simultaneously with the gate insulating film 15, and the poly silicon layer 25 is formed simultaneously with the gate electrode 16. In this case, for example, the depth and the impurity concentration of the n⁻ type layer 22 are preferably the same as those of the n⁻ type drift region 11, the depth and the impurity concentration of the p type layer 3 are preferably the same as those of the p type base region 12, and the depth and the impurity concentration of the n type layer 4 are preferably the same as those of the n⁺ type source region 13.

Thus, when the resistive element is formed simultaneously with the power MOSFET, the manufacturing process can be simplified. Incidentally, because the pitch of the trenches 23 can be changed appropriately in accordance with the mask design, the value of resistance of the resistive element can be controlled by controlling the sectional area of the p type layer 3.

(Fifth Embodiment)

Figure 6:
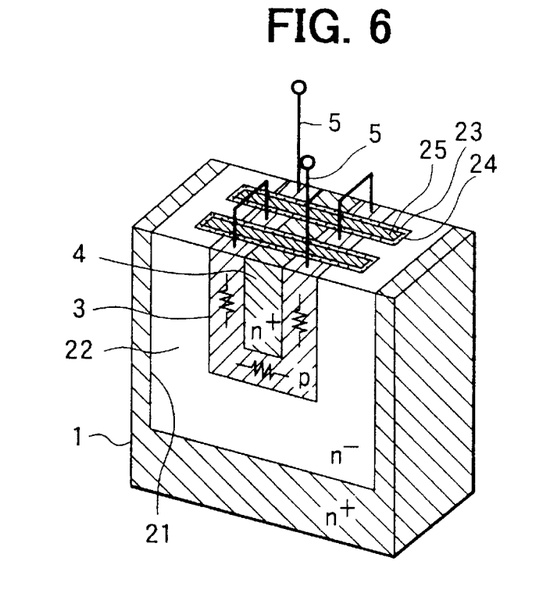
FIG. 6 is a perspective cross-sectional view showing a semiconductor device in a fifth embodiment of the invention.

The fourth embodiment described above shows the wiring members simply connected to the both end portions of the p type layer 3. However, as shown in FIG. 6, the wiring members 5 may be provided to connect in series the plural pieces of the p type layer 3 divided by the trenches 23, the insulating film 24, and the poly silicon layer 25 by connecting neighboring end portions of the pieces of the p type layer 3. Accordingly, the resistance length of the p type layer 3 is substantially lengthened, resulting in increased value of resistance of the resistive element.

(Sixth Embodiment)

Figure 7:
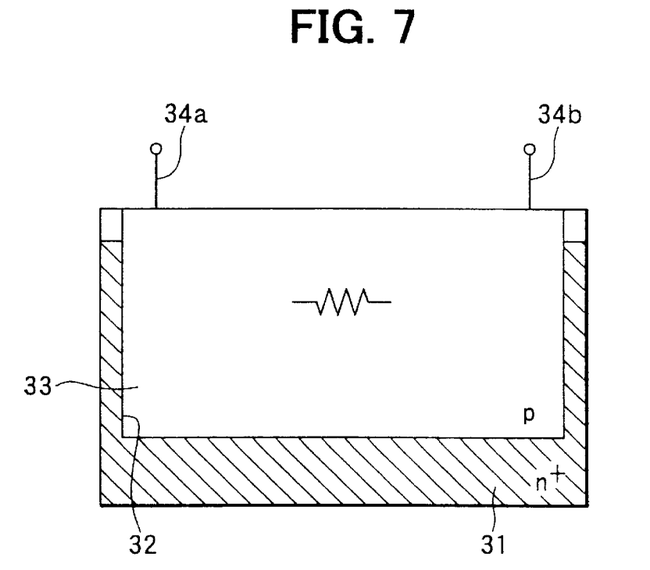
FIG. 7 is a cross-sectional view showing a semiconductor device in a sixth embodiment of the invention.

In the above-mentioned embodiments, the length direction of the resistive element is parallel to the thickness direction (depth direction) of the n⁺ type substrate 1, and the high resistance is obtained accordingly. However, in a sixth embodiment, the width direction of the resistive element is made to coincide with the thickness direction of the n⁺ type substrate 1, and low resistance is provided accordingly. FIG. 7 shows a semiconductor device in this embodiment.

As shown in FIG. 7, a trench 32 is formed in an n⁺ type substrate 31, with a depth of, for example, about 10 to 100 μm. A p type layer 33 is deposited in the trench 32. Electrical wiring members (or electrodes) 34a, 34b are connected to the surface of the p type layer 33. This p type layer 33 constitutes a resistive element. The p type layer 33 is formed by, for example, epitaxial growth, and has an impurity concentration that is uniform in the depth direction of the trench 32 (thickness direction of the substrate 31). For example, the impurity concentration of the p type layer 33 is about $1 \times 10^{14}$ to $1 \times 10^{19}$ cm$^{-3}$.

In the case of forming low resistance, as described above, it is conceivable that the width and the thickness of the resistor are increased to increase the sectional area thereof, or the resistance length is shortened. As opposed to this, in the semiconductor device of the present embodiment, the low resistance of the p type layer 33 can be attained without increasing the width of the p type layer 33 or without shortening the resistance length thereof. That is, because the p type layer 33 is thickened as the depth of the trench 32 is increased, the sectional area of the resistive element increases and the value of resistance of the p type layer 33 decreases by increasing the depth of the trench 32.

Further, because the p type layer 33 is not formed by ion implantation, unlike a diffusion resistor, the p type layer 33 can be thickened without increasing the number of times for the ion implantation and the time period of heat treatment. Thus, in the case of forming the low resistance, the semiconductor device can be obtained with the resistor structure capable of exhibiting sufficient throughput while realizing high integration, and of preventing variation in resistance length.

(Seventh Embodiment)

Figure 8:
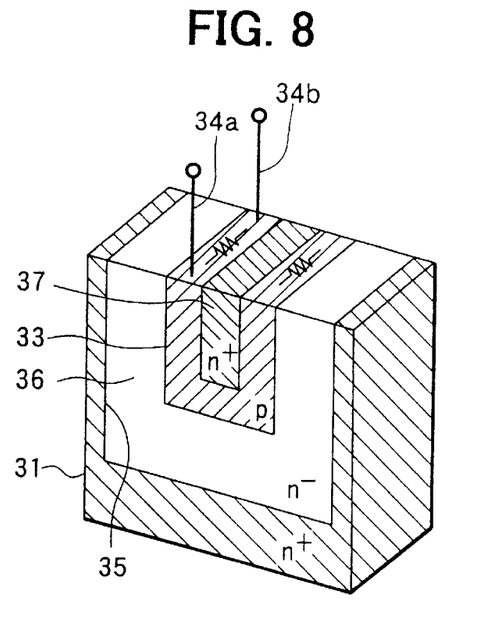
FIG. 8 is a perspective cross-sectional view showing a semiconductor device in a seventh embodiment of the invention.

In a seventh embodiment, the resistive element shown in the sixth embodiment and the power MOSFET shown in the fifth embodiment are provided together. FIG. 8 shows a semiconductor device in the present embodiment, in which the structure of the power MOSFET is omitted because it is substantially the same as that shown in FIG. 5.

As shown in FIG. 8, the basic structure of the resistive element is approximately the same as that shown in FIG. 7 except for the following points. Specifically, in FIG. 8, an n⁻ type layer 36 is disposed in a trench 35 provided in an n⁺ type substrate 31, and accordingly, the n⁻ type layer 36 is so constructed that it is provided between the n⁺ type substrate 31 and the p type layer 33. Further, an n⁺ type layer 37 is provided in the p type layer 33. These are different points. In this case, the p type layer 33 is formed with a U-shape in cross-section, and the path length of the U-shape corresponds to the width of the resistor.

Even in the resistive element, the same effects as those in the sixth embodiment can be attained by making the width direction of the resistive element coincide with the thickness direction of the n⁺ type substrate 31. Also, the resistive element constructed as above is different from the resistive element shown in FIG. 5 only in points that the trenches 23 are not formed, and the connecting arrangement of the wiring members 5 are changed, but is the same in the manufacturing method. Therefore, the resistive element can be fabricated during the manufacture of a power MOSFET.

Figure 9:
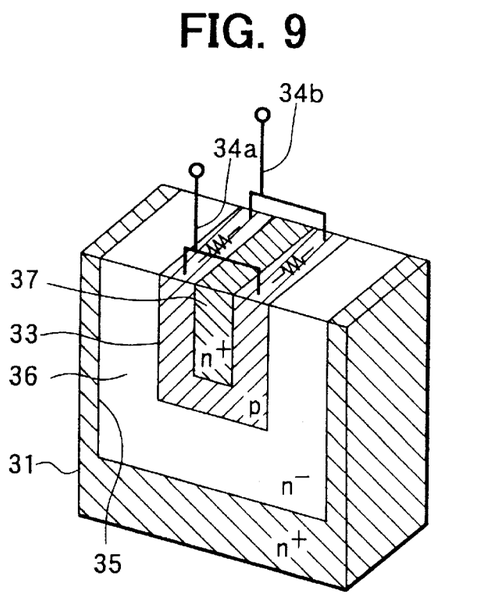
FIG. 9 is a perspective cross-sectional view showing a semiconductor device as a modification of the seventh embodiment.

In this case, as shown in FIG. 9, when both the wiring members 34a, 34b form a U-shape, respectively, and connect both end portions of the U-shaped P type layer 33, it is equivalent to a parallel connection of the resistor, thereby reducing the value of resistance further. Incidentally, in the present embodiment, although the n⁺ type layer 37 is formed at the inner side of the p type layer 33, this n⁺ type layer 37 may be used as a resistive element.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor substrate of a first conductivity type, wherein the substrate has a main surface and a back surface;
   a resistive element of a second conductivity type that is located in a trench formed in the main surface, wherein the resistive element extends inwardly and perpendicularly from the main surface and has a generally U-shaped cross section, the ends of which terminate at the main surface, wherein a resistance length of the resistive element is determined by a U-shaped path that corresponds to the U-shaped cross section, the resistive element having an impurity concentration that is approximately uniform in a direction perpendicular to the main surface;
   a second semiconductor layer of the first conductivity type, wherein the second semiconductor layer is located in the resistive element and extends perpendicularly from the main surface; and
   a pair of electrodes located on a surface of the resistive element and are separated by the second semiconductor layer, wherein the resistance between the electrodes is determined at least by a depth of the resistive element.

2. The semiconductor device of claim 1, wherein each of two side portions of the U-shaped cross-section of the resistive element is longer than a bottom portion thereof that connects the side portions.

3. A semiconductor device comprising:
   a semiconductor substrate of a first conductivity type, wherein the substrate has a main surface and a back surface, and a trench dug from the main surface such that the trench extends in a direction perpendicular to the main surface;
   a resistive element of a second conductivity type, wherein the resistive element is located in the trench to extend perpendicularly to the main surface and having a generally U-shaped cross section, the ends of which terminate at the main surface, and wherein a resistance length of the resistive element is determined by a U-shaped path that corresponds to the U-shaped cross section;
   a second semiconductor layer of the first conductivity type, wherein the second semiconductor layer is located in the resistive element and extends perpendicularly from the main surface; and
   a pair of electrodes, which are located on a surface of the resistive element and are separated by the second semiconductor layer, wherein the resistance between the electrodes is determined at least by a depth of the resistive element.

4. The semiconductor device of claim 3, wherein the resistive element has an impurity concentration that is approximately uniform in the direction perpendicular to the main surface.

5. The semiconductor device of claim 3, wherein each of two side portions of the U-shaped cross-section of the resistive element is longer than a bottom portion thereof that connects the side portions.

6. A semiconductor device comprising:
   a semiconductor substrate of a first conductivity type, having a main surface and a back surface;
   a resistive element provided in a trench formed in the semiconductor substrate and having a generally U-shaped cross section, the ends of which terminate at the main surface, wherein a resistance length of the resistive element is determined by a U-shaped path that corresponds to the U-shaped cross section, wherein the resistive element includes:
      a first semiconductor layer of the first conductivity type, extending perpendicularly from the main surface, the first semiconductor layer having an impurity concentration lower than that of the semiconductor substrate;
      a resistive layer of a second conductivity type, wherein the resistive layer is located in the first semiconductor layer and extends from the main surface in a direction perpendicular to the main surface;
      a second semiconductor layer of the first conductivity type, wherein the second semiconductor layer is located in the resistive layer and extends perpendicularly from the main surface; and
   a power MOSFET provided in the semiconductor substrate, wherein the power MOSFET includes:
      a drift region of the first conductivity type, wherein the drift region extends in the semiconductor substrate perpendicularly from the main surface and has and impurity concentration lower than that of the semiconductor substrate;
      a base region of the second conductivity type, wherein the base region is provided in the drift region and extends perpendicularly from the main surface;
      a source region of the first conductivity type, wherein the source region is located in the base region and extends perpendicularly from the main surface;
      a gate insulating film located on a surface of a trench, wherein the trench is dug from the main surface and extends perpendicularly from the main surface to penetrate the source region and the base region;
      a gate electrode provided on a surface of the gate insulating film;

a second semiconductor layer of the first conductivity type, wherein the second semiconductor layer is located in the resistive element and extends perpendicularly from the main surface; and a pair of electrodes, which are located on a surface of the resistive element and are separated by the second semiconductor layer, wherein the resistance between the electrodes is determined at least by a depth of the resistive element.

7. The semiconductor device of claim 6, wherein:

the drift region and the first semiconductor layer are formed simultaneously;

the base region and the resistive layer are formed simultaneously; and the source region and the second semiconductor layer are formed simultaneously.

8. The semiconductor device of claim 6, wherein:

the drift region is identical with the first semiconductor layer in depth and impurity concentration;

the base region is identical with the resistive layer in depth and impurity concentration; and the source region is identical with the second semiconductor layer in depth and impurity concentration.

9. A semiconductor comprising:

a semiconductor substrate of a first conductivity type, wherein the substrate has a main surface, a back surface, and a trench formed from the main surface such that the trench extends in a direction perpendicular to the main surface;

a resistive element of a second conductivity type, wherein the resistive element is located in the trench and has an impurity concentration that is substantially homogeneous in a direction perpendicular to the main surface, wherein the resistive element has a generally U-shaped cross section, the ends of which terminate at the main surface, wherein a resistance length of the resistive element is determined by a U-shaped path that corresponds to the U-shaped cross section;

a second semiconductor later of the first conductivity type, wherein the second semiconductor layer is located in the resistive element and extends perpendicularly from the main surface; and a pair of electrodes, which are connected to the resistive element and are separated by a predetermined distance, wherein the resistance between the electrodes is determined at least by a depth of the trench.

10. The semiconductor device of claim 9, wherein the electrodes are located such that current flows through the resistive element in a direction that is generally parallel to walls defining the trench.

* * * * *